US 6,587,343 B2

(12) United States Patent
Novotny et al.

(10) Patent No.: US 6,587,343 B2
(45) Date of Patent: *Jul. 1, 2003

(54) WATER-COOLED SYSTEM AND METHOD FOR COOLING ELECTRONIC COMPONENTS

(75) Inventors: Shlomo Novotny, Wayland, MA (US); Arthur S. Rousmaniere, Andover, MA (US); Marlin Vogel, Brentwood, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/994,498

(22) Filed: Nov. 27, 2001

(65) Prior Publication Data

US 2003/0043546 A1 Mar. 6, 2003

Related U.S. Application Data

(60) Provisional application No. 60/315,828, filed on Aug. 29, 2001.

(51) Int. Cl.[7] .................................................. H05K 7/20
(52) U.S. Cl. ................. 361/698; 62/259.2; 165/104.33; 257/714; 361/700
(58) Field of Search .............................. 62/440, 259.2; 165/80.3, 80.4, 121–126, 104.33, 185; 415/213.1, 214.1; 257/706, 707, 713, 714, 715, 722; 361/687, 690, 695, 697, 699, 700, 704, 715, 717–720, 698

(56) References Cited

U.S. PATENT DOCUMENTS

| | | | |
|---|---|---|---|
| 4,729,424 A | 3/1988 | Mizuno et al. | 165/30 |
| 5,183,104 A | 2/1993 | Novotny | 165/104.33 |
| 5,406,807 A * | 4/1995 | Ashiwake et al. | 62/376 |
| 5,535,094 A | 7/1996 | Nelson et al. | 361/697 |
| 5,706,668 A | 1/1998 | Hilpert | 62/259.2 |
| 5,912,802 A | 6/1999 | Nelson | 361/695 |
| 6,029,742 A | 2/2000 | Burward-Hoy | 165/80.4 |
| 6,050,327 A | 4/2000 | Gates | 165/80.3 |
| 6,205,796 B1 | 3/2001 | Chu et al. | 62/94 |
| 6,205,803 B1 | 3/2001 | Scaringe | 62/259.2 |
| 6,213,194 B1 | 4/2001 | Chrysler et al. | 165/80.3 |
| 6,438,984 B1 * | 8/2002 | Novotny et al. | 62/259.2 |

* cited by examiner

Primary Examiner—Gerald Tolin
(74) Attorney, Agent, or Firm—Bromberg & Sunstein LLP

(57) ABSTRACT

A water-cooled system and method for cooling electronic components. The system includes a surface. At least one electronic component is coupled to the surface, the at least one electronic component including an integrated circuit. A closed-loop fluidic circuit is coupled to the surface for removing heat from the integrated circuit. The closed-loop fluidic circuit includes a heat exchanger. A blower is coupled to the surface, the blower having a first port, a second port, and an impeller that rotates around an axis. The blower is oriented such that the axis is perpendicular to the surface and non-intersecting with the heat exchanger, wherein the blower moves air through the heat exchanger.

42 Claims, 10 Drawing Sheets

WATER-COOLED SYSTEM AND METHOD FOR COOLING ELECTRONIC COMPONENTS

PRIORITY

This application claims priority from U.S. provisional application serial No. 60/315,828, filed Aug. 29, 2001, entitled "System and Method for Cooling Circuit Board Components", the disclosure of which is incorporated herein, in its entirety, by reference.

TECHNICAL FIELD

The present invention relates generally to a water-cooled system and method for cooling electronic components, such as an integrated circuit.

BACKGROUND OF THE INVENTION

Cooling of electronic components is becoming increasingly significant. The trend in integrated circuit (IC) design, and in particular, central processor units (CPUs), is increased speed and circuit density. This increased speed and density, in turn, causes the IC to generate more heat. Without sufficient cooling, the IC may run slower and suffer degradation leading to a shortened life span.

Compounding this problem is that circuit boards are typically housed in enclosures that are increasingly becoming smaller in size. For example, 1U enclosures allow for a circuit board height of less than 1.75". Additionally, circuit boards stacked in a rack chassis are typically tightly spaced together, further complicating cooling designs.

A system fan is typically utilized to cool the components in an electronic housing. FIG. 1 shows a typical computer enclosure 1. One or more circuit boards 3 containing ICs are located inside a chassis housing 2 in various orientations. A system fan 4 is mounted on one side of chassis housing 2, typically the rear of chassis 2 for aesthetic purposes. System fan 4 creates airflow that removes heat generated by the ICs.

Various concerns arise when implementing system fan 4. The airflow generated in chassis 2 must direct air across chassis 2 so that components located opposite fan 4 will be cooled. Such airflow will be uneven due to the various flow impedances created by the components in chassis 2. Additionally, airflow reaching those components located furthest from fan 4 will have reduced velocity, which in turn decreases the amount of heat that can be removed. Furthermore, system fan 4 is also a single point failure with regards to cooling, making reliability of fan 4 significant. Loss of fan 4 may be catastrophic and bring down the entire system. While additional fans may be utilized, this is typically not an option due to decreasing size requirements.

Heat sinks with integrated axial fan(s) are also used. The fan sits atop the heat sink, which is typically mounted to the top surface of an IC. Heat dissipated from the IC is transferred to the heat sink, where it is removed by airflow generated by the fan. This approach has several drawbacks. The thermal efficiency of a heat sink fan is hard pressed to cool the latest high powered CPUs. Attempts to increase the thermal efficiency of the fan by increasing the fan's propeller's rotational speed forces the fan to consume more power, which stresses the fan's motor bearings and typically leads to degradation in fan reliability. Hot air reflected back from the heat sink also adversely affects the fan's bearings and reliability. Additionally, only the IC below the fan is cooled. Other components on the board must be cooled using alternative methods, such as a system fan. Furthermore, mounting the fan atop the heat sink stresses already tight size requirements.

Instead of a fan, blowers that sit atop the heat sink have also been used, with the airflow generated by the blower directed down and through the heat sink by use of a manifold. The main difference between fans and blowers is in their flow and pressure characteristics. Fans deliver air in an overall direction that is parallel to the fan blade axis and can be designed to deliver a high flow rate, but tend to work against low pressure. In comparison, a blower 21 delivers air in a direction that is perpendicular to the blower's impeller 22 axis, typically at a relatively low flow rate but against high pressure, as shown in FIG. 2. Blowers can produce approximately three times more static pressure than a fan, making blowers more suitable for cooling high-powered CPUs. However, as with fans, mounting a blower atop a heat sink increases the height profile of the circuit board.

Blowers have also been mounted in the chassis away from the electronic components. The blower may act as a system fan, or alternatively airflow is directed to various boards or electronic components using air ducts. This adds complexity to the packaging and manufacturing process. Additionally, the blower or blowers, located apart from the circuit board, take up much needed space elsewhere in the enclosure.

To cool very high-powered components on circuit boards, liquid cooling driven by a pump that delivers either chilled or room temperature water has been used. Central pumps within the enclosure or alternately, an external pump, are typically used. Historically, the relatively large size of the pump has been impractical for today's increasingly smaller sized enclosures and parallel oriented circuit board rack assemblies. In addition to consuming space within the enclosure, using an external or internal system pump requires interconnects to each circuit board cooled which may be a source of leakage over time. Additionally, a centralized fan, or fans, is typically used to move air within the system, which, as described above, has several drawbacks and is inherently not sufficient to cool each of the various components in the system.

Alternatively, refrigerant-cooled systems have been used. Again, the large size of the compressor and the use of fans have historically made use in smaller sized enclosures or in parallel circuit board rack assemblies impractical.

Adding further complications is that the thermal characteristics of electronic components on a given circuit board are difficult to forecast and typically cannot be determined without actual experimentation. This experimentation often entails switching between various types of cooling methodologies, such as air, liquid, and refrigerant cooled systems, each system requiring additional effort and cost to implement. Additionally, upgrading circuit boards with, for example, the latest high-powered processor, often require costly modifications to upgrade thermal cooling capacity.

SUMMARY OF THE INVENTION

In accordance with one embodiment of the invention, a system for cooling electronic components is presented. The system includes a surface. One or more electronic components are coupled to the surface, the one or more electronic components including an integrated circuit. A closed-loop fluidic circuit is coupled to the surface for removing heat from the integrated circuit. The closed-loop fluidic circuit includes a heat exchanger. A blower is coupled to the surface, the blower having a first port, a second port, and an impeller that rotates around an axis. The blower is arranged beside the heat exchanger to provide at least one air path between the second port of the blower and the heat exchanger that is parallel to the plane of the surface.

In accordance with another embodiment of the invention, a system for cooling electronic components includes a surface. One or more electronic components are coupled to the surface, the one or more electronic components including an integrated circuit. A closed-loop fluidic circuit is coupled to the surface for removing heat from the integrated circuit. The closed-looped fluid circuit includes a heat exchanger. A blower is coupled to the surface, the blower having a first port, a second port, and an impeller that rotates around an axis. The blower is oriented such that the axis is perpendicular to the surface and non-intersecting with the heat exchanger, wherein the blower moves air through the heat exchanger.

In accordance with another embodiment of the invention, a cartridge that attaches to a surface includes a shroud. A closed-loop fluidic circuit is attached to the shroud. The cartridge may further include a blower coupled to the shroud. The surface may be a circuit board. The closed-loop fluidic circuit may absorb heat from an integrated circuit coupled to the circuit board. The system may be enclosed within a 1U enclosure. The system may have a height of less than 1.75". The closed-loop fluidic circuit may include a heat exchanger, a cold plate, and a pump.

In accordance with yet another embodiments of the invention, a system for cooling electronic components includes a first surface. One or more electronic components, including an integrated circuit, are coupled to the first surface. A module is attached to a second surface. The module includes a closed-loop fluidic circuit for removing heat from the integrated circuit. The closed-loop fluidic circuit includes a heat exchanger and a blower. The blower moves air through the heat exchanger and also across at least one of the one or more electronic components.

In related embodiments, the first surface and second surface may be non-overlapping, or the second surface may be located above the first surface. The blower's impeller axis may be perpendicular to the plane of the first surface. The blower may provide at least one airflow path between a port of the blower and the one or more electronic components that is parallel to the plane of the first surface.

In accordance with still another embodiment of the invention, a system for cooling electronic components includes a first surface. One or more electronic components, including an integrated circuit, are coupled to the first surface. A module is coupled to and positioned beside the first surface. The module includes a closed-loop fluidic circuit for removing heat from the integrated circuit. The closed-loop fluidic circuit includes a heat exchanger and a blower for moving air through the heat exchanger and also across at least one of the one or more electronic components. The blower's impeller axis may be perpendicular to the plane of the first surface. The blower may provide at least one airflow path between a port of the blower and the one or more electronic components that is parallel to the plane of the first surface

BRIEF DESCRIPTION OF DRAWINGS

The foregoing features of the invention will be more readily understood by reference to the following detailed description, taken with reference to the accompanying drawings, in which.

DETAILED DESCRIPTION

A system and method for cooling at least one electronic component attached to a surface is presented. The surface may be, for example, but not limited to, a circuit board. Electronic components include electronic devices whose operation involves the motion of electrical charge carriers, such as an integrated circuit. Electronic components may be attached to the surface using, for example, but not limited to, adhesive, soldering, welding, thru hole and surface mount technologies.

Figure 1:
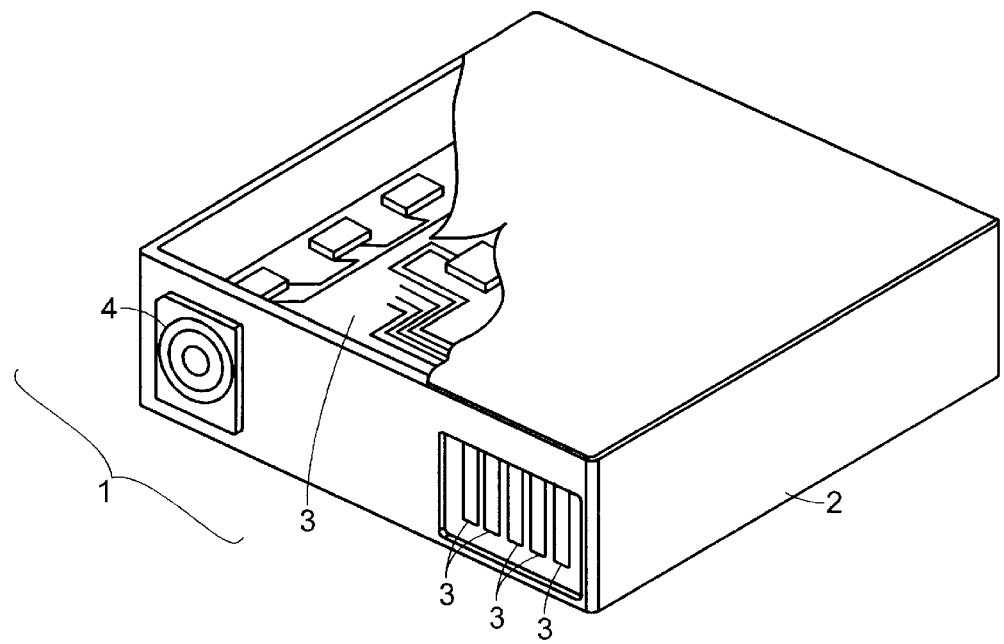
FIG. 1 shows a perspective view of a typical computer enclosure that includes one or more circuit boards (Prior Art)
Figure 2:
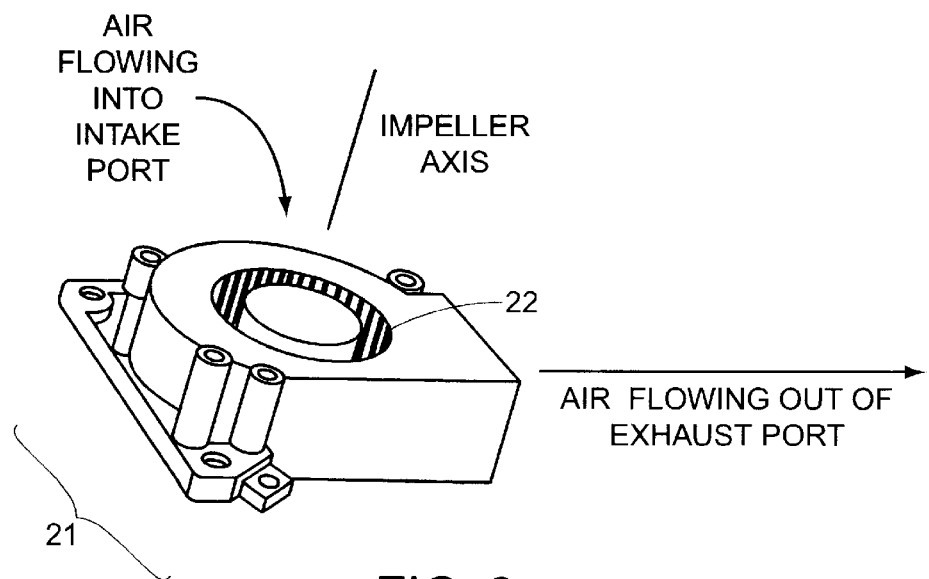
FIG. 2 shows a perspective view of a typical blower (Prior Art)
Figure 3:
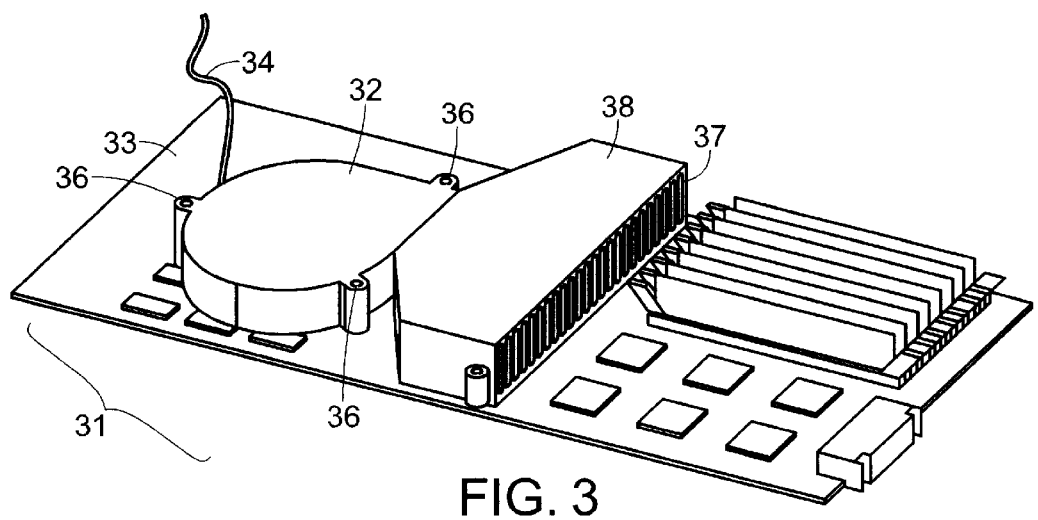
FIG. 3 shows a perspective view of a system for cooling electronic components in accordance with one embodiment of the invention.

FIG. 3 is a system 31 for cooling at least one electronic component attached to a surface 33, in accordance with one embodiment of the invention. Surface 33 may be a circuit board. The system 31 includes a blower 32. Blower 32 has a first port 44 (seen in FIG. 4, which is a side view of system 31), a second port 55 (seen in FIG. 5, which is the system of FIG. 3 with blower 32 lifted from surface 33), and an impeller having blades that rotate about an axis. Motion of the impeller causes air to flow into first port 44 and out second port 55, such that first port 44 and second port 55 acts as an air intake port and air exhaust port, respectively. Alternatively, the motion of the impeller may cause air to flow in the reverse direction, such that air flows into second port 55 and out first port 44. In this case, second port 55 acts as the air intake port, with first port acting as the air exhaust port. Current to power blower 32 is typically provided by lead wires 34, which can be connected to a power source that is external to, or located on, surface 33. Lead wires 34 may be easily detachable from the power source.

Blower 32 is coupled to surface 33, or alternatively, to a shroud (described in more detail below) which is further coupled to surface 33. Blower 32 may be attached to surface 33 by, but not limited to, using an adhesive or epoxy, using thru holes 36 located on blower 32 in combination with various mounting hardware, welding, and soldering. Blower 32 may be directly coupled to surface 33, such that the blower 32 and/or any intervening mounting material or hardware contact the surface of surface 33. To provide clearance, spacers may be located between blower 32 and surface 33. The spacers may be bonded to blower 32 or surface 33 using, for example, epoxy or other adhesives.

Figure 4:
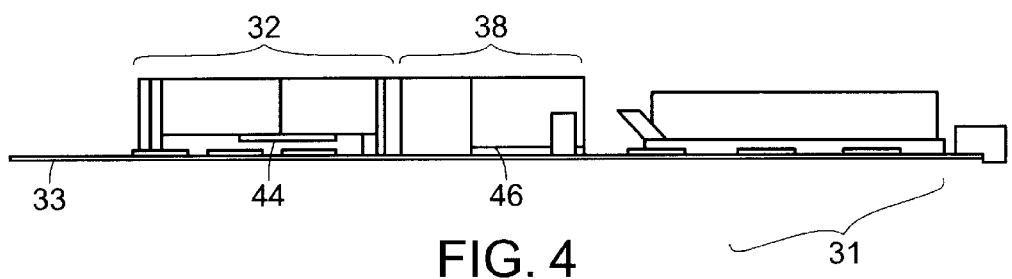
FIG. 4 shows a side view of the system shown in FIG. 3.
Figure 5:
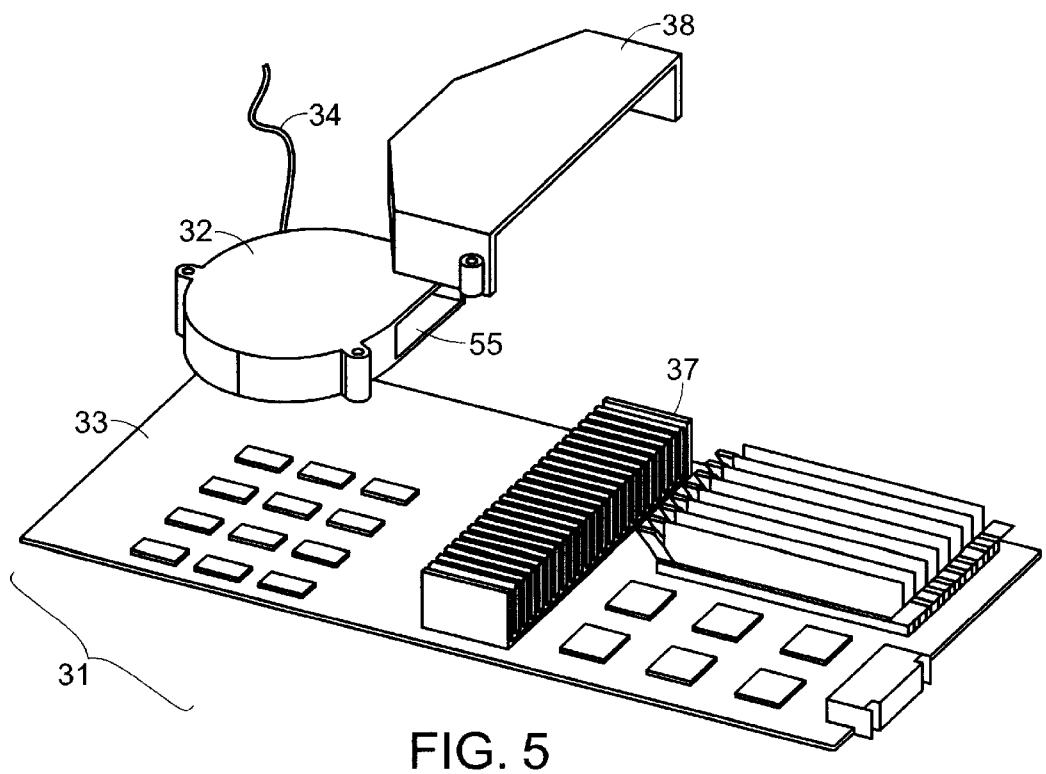
FIG. 5 shows a perspective view of the system shown in FIG. 3, with the blower lifted from the surface.

Blower 32 is oriented such that the impeller axis is perpendicular to surface 33, reducing the height of blower 32 relative to surface 33. In various embodiments of the invention, first port 44 faces surface 33, as shown in FIGS. 3–5, such that air flowing across first port 44 flows in a channel formed by blower 32 and surface 33. The channel is the space or clearance between the blower 32 and the surface 33. To allow air to flow beneath blower 32, spacers may be placed between blower 32 and surface 33, as described above. Clearance provided between the surface 33 and the blower 32 is typically dictated by size constraints placed on the system, with minimum clearance approximately, but not limited to, 0.1". One or more electronic components may be located underneath and/or in close vicinity to first port 44, such that air flowing in, or alternatively, out of first port 44 flows across and removes heat generated by the one or more electronic components. In this manner, the footprint below blower 32 can be efficiently used to mount electronic components, and is not wasted.

Alternatively, first port 44 may face opposite surface 33. Spacing between blower 32 and surface 33 is thus not required, however care must then be taken that there is sufficient spacing above first port 44 for air to flow into blower 32. In further embodiments of the invention, blower 32 may include both a port facing surface 33 and a port facing opposite surface 33, with both ports acting either as an air intake port or an air exhaust port. Clearance for airflow should then be provided both above and below blower 32.

An integrated circuit 46 (seen in FIG. 4) contacting a heat sink 37 may be attached to surface 33, wherein blower 32 generates an airflow path through heat sink 37. To minimize height profile, blower 32 is not mounted atop heat sink 37, and may be oriented such that its impeller axis is does not intersect with heat sink 37. Blower 32 may also be arranged beside heat sink 37 to provide at least one air path between second port 55 and heat sink 37 that is parallel to the plane of the surface 33. As opposed to a blower mounted atop heat sink 37, a manifold is therefore not required to redirect the airflow down through the heat sink (or alternatively up to second port 55, if second port 55 is acting as an air input port as opposed to an air exhaust port). In arranging blower 32 beside heat sink 37, blower 32 may make contact with heat sink 37, or alternatively, blower 32 may be separated and located a distance apart from heat sink 37.

Heat sink 37 is typically made of a thermally conductive material, such as aluminum, and includes a flat plane on the bottom that is designed to make smooth contact with the top surface of integrated circuit 46. To further increase the surface area for dissipating heat from integrated circuit 46, heat sink 37 may include a plurality of fins that project transverse to the flat bottom of heat sink. These fins may be open-ended at the top of heat sink 37. Alternatively, the top of heat sink 37 may be enclosed, forming channels through which air can pass. Instead of mounting heat sink 37 atop the integrated circuit 46, a heat conductor may transfer heat from a mounting plate sitting atop the integrated circuit 46 to a heat sink mounted elsewhere on surface 33. Other heat sink configurations that are well known in the art may also be utilized.

To direct the air flowing through second port 55 across heat sink 37 or other electronic components, a shroud 38 may be attached to surface 33. The size and shape of shroud 38 is variable. For example, shroud 38 may extend over the top of heat sink 37, particularly when heat sink 37 includes open-ended fins. Shroud 38 may also extend over the top of, and possibly share the same mounting hardware, as blower 32. As described above, blower 32 may be coupled to the shroud 38 rather than directly to the surface 33. To support shroud 38, spacers may be positioned in a number of locations on surface 33. Various materials may be used to construct shroud 38, such as, but not limited to, metal or molded plastic.

One or more electronic components may be located on surface 33 such that air flowing across heat sink 37 also flows across one or more electronic components. Blower 32 may then be selected such that the static pressure produced by blower 32 is sufficient to cool both heat sink 37 and the one or more electronic components, which may include for example, custom memory packages for a central processor associated with heat sink 37.

Mounting blower 32 to surface 33 or shroud 38 instead of atop heat sink 37 reduces the height profile of system 31. For example, height of system 31 may be, but is not limited to, less than 1.75", allowing it to fit into a 1U enclosure. Furthermore, the length and width of blower 34 is not constrained by the top surface size of the heat sink 37, allowing for a larger and thus more reliable blower to be utilized. Removal and/or replacement of heat sink 37 and integrated circuit 46 is also less complex without a blower mounted atop heat sink 37.

Figure 6:
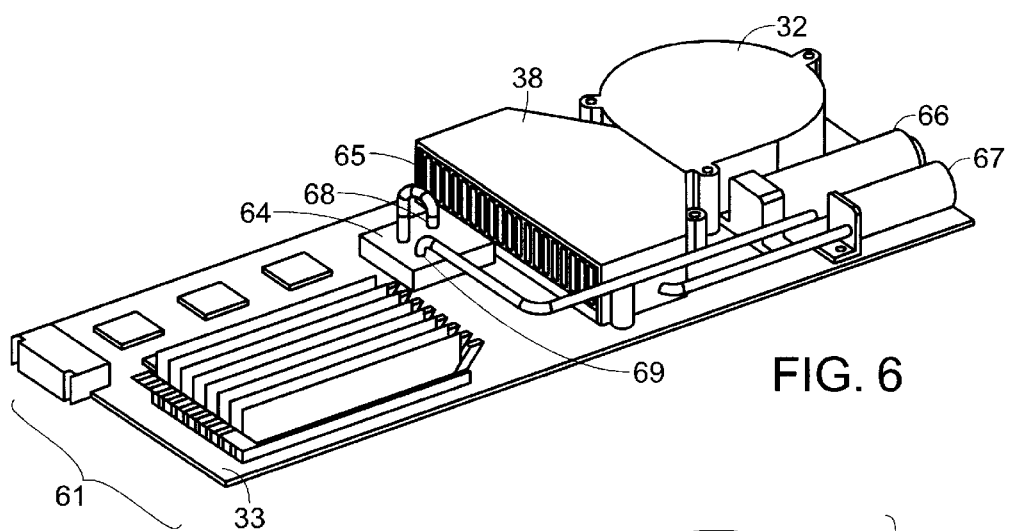
FIG. 6 shows a perspective view of a system for cooling electronic components that includes a closed-loop fluidic circuit, in accordance with one embodiment of the invention.
Figure 7:
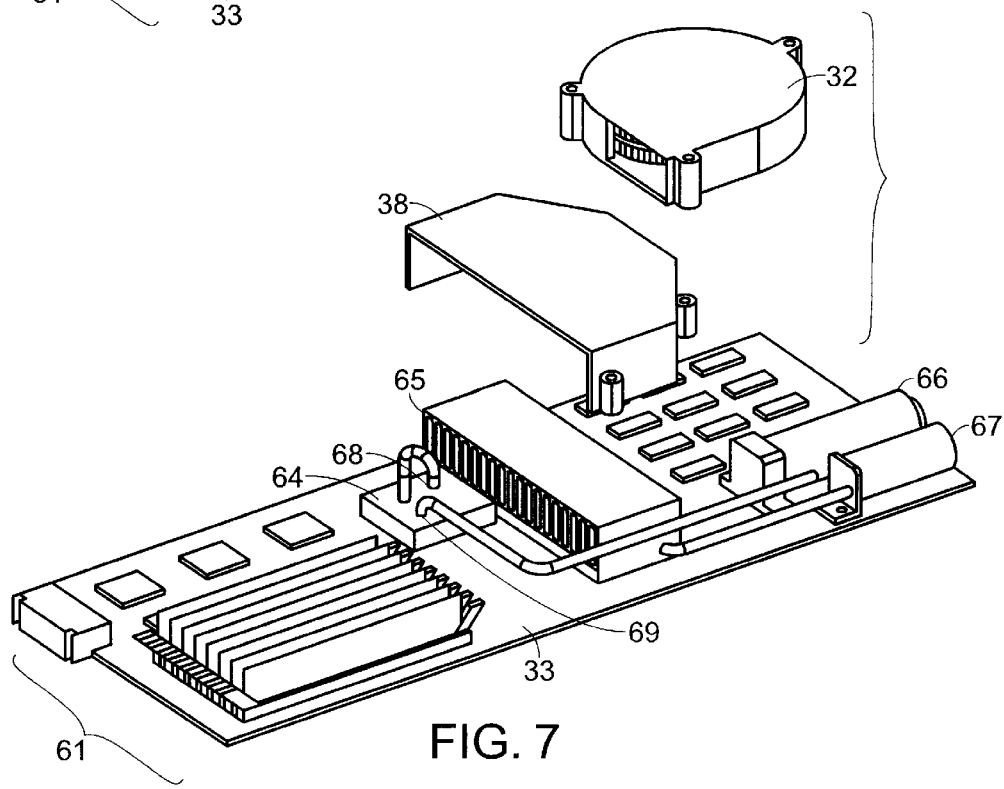
FIG. 7 shows a perspective view of the system shown in FIG. 6, with the blower lifted from the surface.
Figure 8:
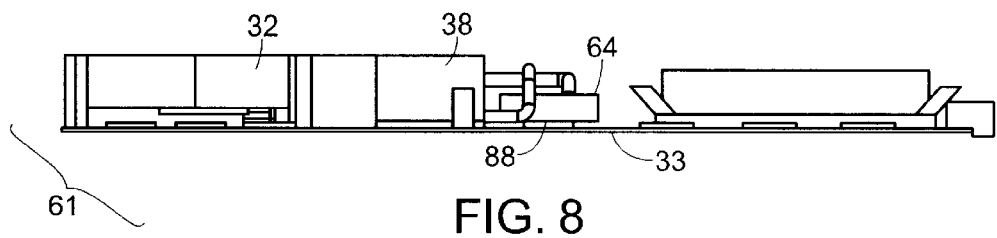
FIG. 8 shows a side view of the system shown in FIG. 6.

In accordance with an embodiment of the invention, heat sink 37 is replaced by a heat exchanger, the heat exchanger being part of a closed-loop fluidic circuit. The closed-loop fluidic circuit may include a cold plate 64, heat exchanger 65, and a pump 66, as shown in FIG. 6. FIG. 7 is a view of FIG. 6 that shows blower 32 lifted from surface 33, while FIG. 8 is a side view of FIG. 6. Pump 66 may have a size, for example, of less than 1.75" in diameter and approximately 4–6" in length. Pump 66 combined with the height efficient use of blower 32 allows system 61 to be integrated, for example, on a single circuit board and at the same time have a height profile of less than, for example, 1.75", such that it can fit into a 1U enclosure. The low profile of system 61 also allows a plurality of systems 61 to be mounted in parallel, with minimal spacing required.

Referring to FIGS. 6–8, cold plate 64 is coupled to one or more electronic components 88 attached to surface 33 using various technologies known in the art, including, but not limited to, adhesive or mechanical technologies. Cold plate 64 can be made of any suitable material having sufficient heat conductivity such that the heat generated by electronic component 88 is transferred to cold plate 64. Examples of such materials include, but are not limited to, copper, aluminum, and stainless steel. Cold plate 64 may be separate from heat exchanger 65, or alternately, may be an integral part of heat exchanger 65.

Cold plate 64 has both a fluid inlet 68 and a fluid outlet 69, and typically includes tubes through which fluid flows. The transfer of fluid out of cold plate 64 acts to remove the heat transferred from electronic component 88 to cold plate 64. The fluid may be water, water mixed with ethylene glycol, or other fluorinerts/fluid coolants known in the art.

The fluid that flows into fluid inlet 68 is driven by pump 66 coupled to surface 33. Pump 66 may be one of a number of pumps known in the art, such as, but not limited to, a centripetal pump or rotary vane. Pump 66 may be an encased pump wherein the fluid is isolated from the pump's 66 motor. Pump 66 may also be magnetically coupled, which typically increases reliability. In various embodiments, pump 66 runs continuously when power to the system 61 is applied. The size of pump 66 may be, but is not limited to, less than 1.75" in diameter and approximately 4–6" in length, such that system 61 can fit into a 1U enclosure.

Fluid that has been heated by cold plate 64 is received and flows through heat exchanger 65 which is mounted to surface 33. The input of heat exchanger 65 may be coupled to fluid outlet 69 of cold plate 64, however the closed-loop fluidic circuit is not limited to this arrangement, the input of heat exchanger 65 alternatively being coupled to the output of pump 66 for example. The fluid typically flows through a coil of thin-walled tubes in heat exchanger 65. Heat from the fluid is transferred to the tubes in the heat exchanger 65, which are then cooled by airflow generated by blower 32. As described in above embodiments, a shroud 38 may be utilized to direct air through heat exchanger 65.

Tubing used to connect the elements in the closed-loop fluidic circuit may be made of various materials, such as, but not limited to, metals, plastic, and rubber. Metal components may be attached by welding or soldering the components together.

In a related embodiment, pump 66 may not be attached to surface 33, and instead may be located in a position external to surface 33. The size of pump 66 can then be increased without affecting the low profile of system 61. Tubing is used to couple pump 66 to the appropriate closed-loop fluidic circuit components attached to surface 33. In various embodiments, pump 66 may be attached to, and act as a central pump, for a plurality of systems 61, which may be located in a single housing, or alternatively, multiple housings. Pump 61 may be located in the same enclosure as system(s) 61 to which it is coupled, however this is not a requirement and pump 61 may be located elsewhere.

In other related embodiments, the closed-loop fluidic circuit includes an expansion tank 67. Expansion tank 67 allows space in the fluidic circuit for fluid expansion and may also aid in trapping air bubbles in the system. A plurality of cold plates may also be coupled to heat exchanger 65, each cold plate coupled to at least one electronic component.

Figure 9:
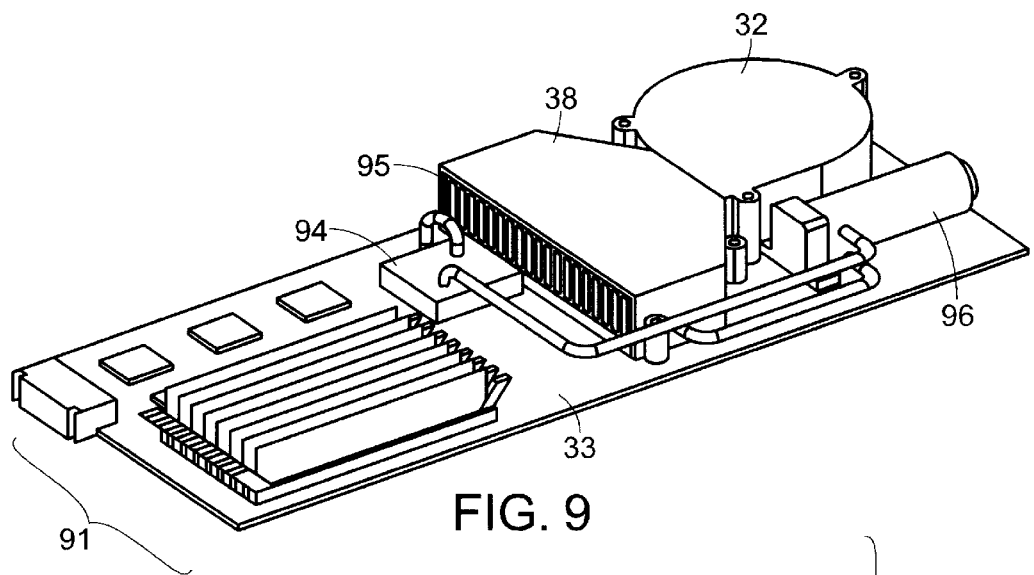
FIG. 9 shows a perspective view of a system for cooling electronic components that includes a closed-loop refrigeration circuit, in accordance with one embodiment of the invention.
Figure 10:
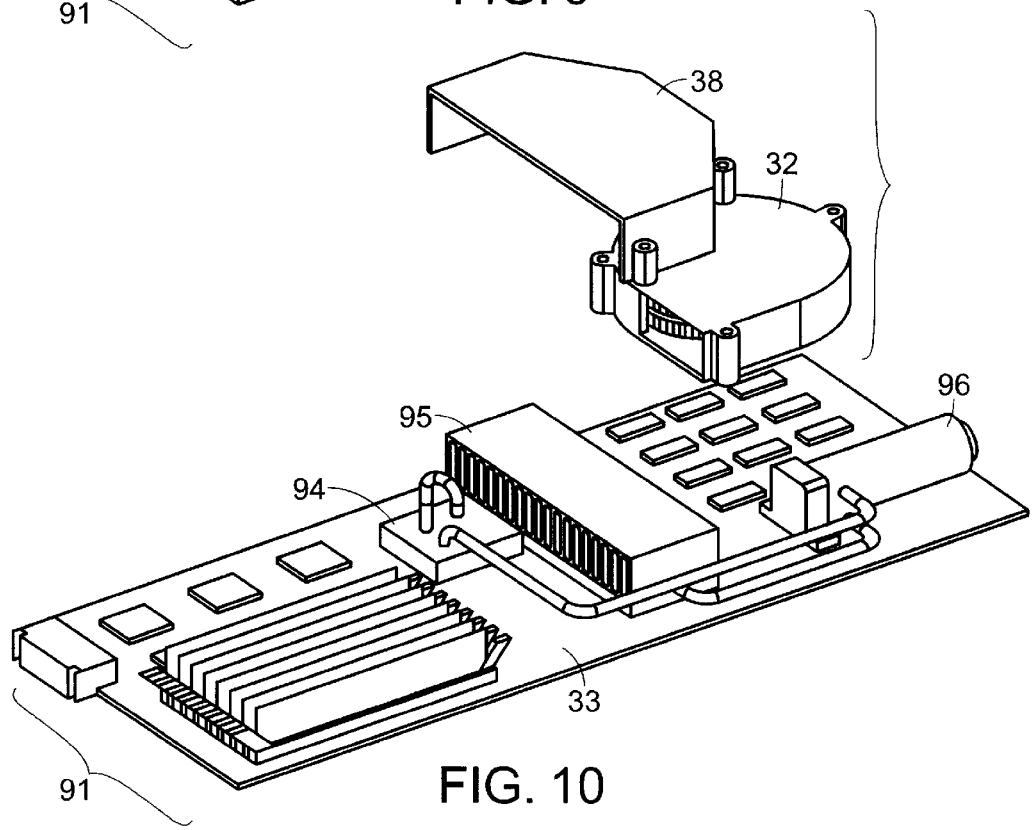
FIG. 10 shows a perspective view of the system shown in FIG. 9, with the blower lifted from the surface.

In accordance with another cooling system, heat sink 37 is replaced by a condenser 95 that is part of a closed-loop refrigeration circuit, as shown in FIG. 9. The closed-loop refrigeration circuit may include, but is not limited to, an expander/evaporator 94, a condenser 95, and a compressor 96. Refrigerant used may be R134A, however, other refrigerants known in the art may be used. FIG. 10 is a view of FIG. 9 with blower 32 lifted from surface 33, while FIG. 11 is a side view of FIG. 9.

Figure 11:
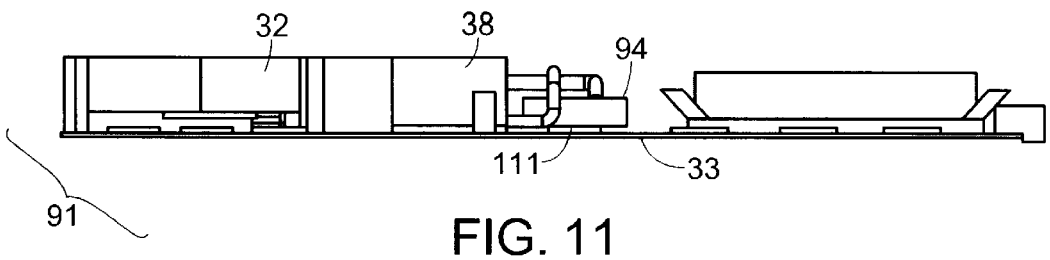
FIG. 11 shows a side view of the system shown in FIG. 9.

Referring to FIGS. 9–11, compressor 96, which is mounted to surface 33, compresses refrigerant gas. This raises the refrigerant's pressure and temperature. Compressor 96 is coupled, via supply lines, to condenser 95, also mounted to surface 33. Condenser 95 includes coils that allow the hot refrigerant gas to dissipate heat, the coils being cooled by air generated by blower 32. Upon being cooled, the refrigerant gas condenses into refrigerant liquid at high pressure whereupon it flows into expander/evaporator 94. Expander/evaporator 94 includes an expander device, which typically is an expansion valve. When the fluid flows through the expander device, the liquid refrigerant is moved from a high-pressure zone to a low-pressure zone. This allows the refrigerant to expand and evaporate within expander/evaporator 94. As the refrigerant evaporates, its temperature drops. Integrated circuit 111, which is tightly coupled to expander/evaporator 94, passes heat to the vaporized refrigerant, thus cooling integrated circuit 111. The refrigerant gas is then returned to compressor 96, where the cycle repeats.

The refrigeration system 91 may include various refrigeration control electronics (not shown). Such electronics may include, but are not limited to, compressor 96 pump and motor drive/control electronics and various thermocouples used to measure the critical fluid temperatures. The refrigeration electronics may be coupled to surface 33 by, but not limited to, adhesives, soldering, welding, thru hole and surface mount technologies.

System 91, including blower 32, is integrated onto a single surface 33. Compressor may be of various types, including a linear compressor. Alternatively, compressor 96 may not be attached to surface 33, and instead may be located in a position external to surface 33. The size of the compressor 96 can then be increased without affecting the low profile of system 91. Tubing is used to couple compressor 96 to the appropriate closed-loop refrigeration circuit components attached to surface 33. Compressor 96 may be located in the same enclosure as system(s) 91 to which it is coupled, however this is not a requirement and compressor 96 can be located elsewhere. In various embodiments, compressor 96 may be centrally located and coupled to a plurality of systems 91, which may be located in a single housing, or alternatively, multiple housings.

In other related embodiments of the invention, a filter is placed in front of expander/evaporator 94 to trap particulate matter present in the refrigerant stream. Additionally, an accumulator may be inserted in front of compressor 96 to prevent liquid refrigerant from entering compressor 96. An electronically controlled hot gas bypass valve may also be utilized, which operates to pass hot refrigerant gases from compressor 96 directly to expander/evaporator 94 when the temperature of the gas is sufficiently low.

Figure 12:
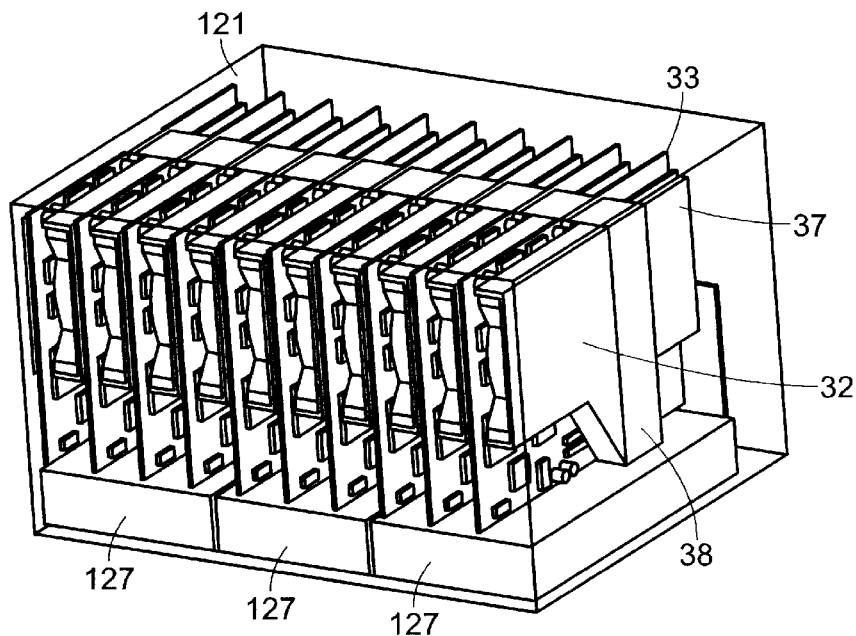
FIG. 12 shows a perspective view of an electronic housing with one or more surfaces associated with a system for cooling electronic components, in accordance with one embodiment of the invention.

In accordance with yet another embodiment of the invention, surface 33 may be attached to a mounting fixture that may be located inside an electronic housing 121, as shown in FIG. 12. Electronic housing 121 provides structural support for components located therein. Electronic housings include, but are not limited to, desktop or tower computer enclosures/housings, and racks that may or may not be open-ended. Electronic housing 121 may be of varying size, including 1U. An electronic housing can hold any number of surfaces/circuit boards 33. Vents in the mounting fixture 121 may be utilized to allow air to flow from the exterior of the mounting fixture 121.

Surface 33 can be attached to the mounting fixture within the electronic housing 121 using, but not limited to, slots in the mounting fixture for inserting surface 33, or attaching surface 33 to the mounting fixture using nylon standoffs and grounding screws. Power for surfaces 33 is typically supplied by power supplies 127 located in the housing, which convert the AC power being fed into the housing to the appropriate DC voltage.

As shown in FIG. 12, each circuit board in electronic housing 121 may include one of the systems described in the above embodiments. Alternatively, only some of the surfaces 33 in electronic housing 121 may include one of the systems described in the above embodiments. Surfaces 33 may be mounted in a parallel fashion, with the low profile of blower 32 allowing surfaces 33 to be in close proximity with each other. To assist in moving air, particularly over circuit boards not associated with above-described embodiments, a system fan may be utilized.

In accordance with another embodiment of the invention, the blower 32 and various components of the cooling system form a module distinct from surface 33. The module may, or may not, not overlap surface 33. For example, the module may be positioned or attached to surface 33 such that the module is in front of, behind, or above surface 33. The blower in the module may be positioned such that airflow generated by the blower includes at least one air path from a port of the blower to the one or more electronic components that is parallel to the plane of the surface.

Figure 13:
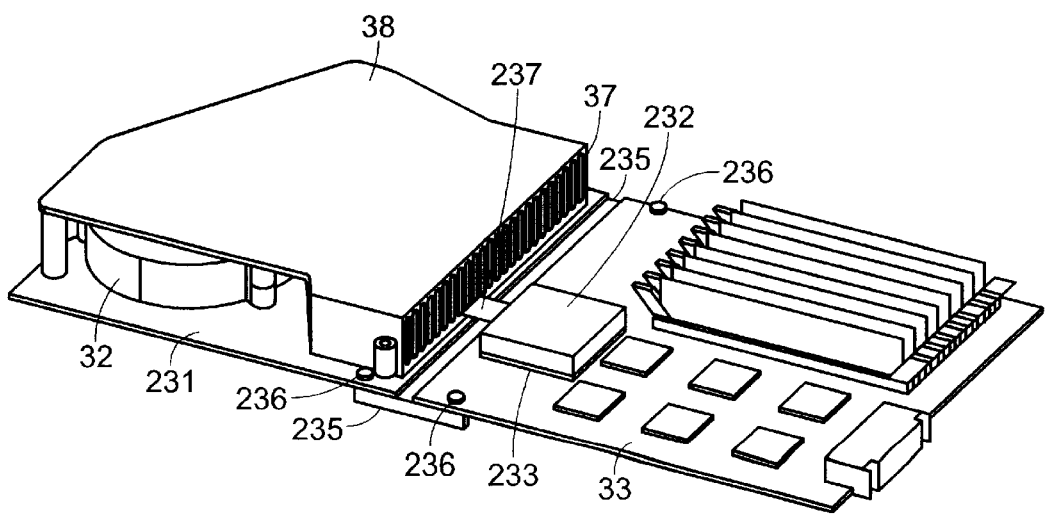
FIG. 13 is a perspective view of a system for cooling electronic components in which a blower and heat sink is coupled to a second surface, in accordance with one embodiment of the invention.
Figure 14:
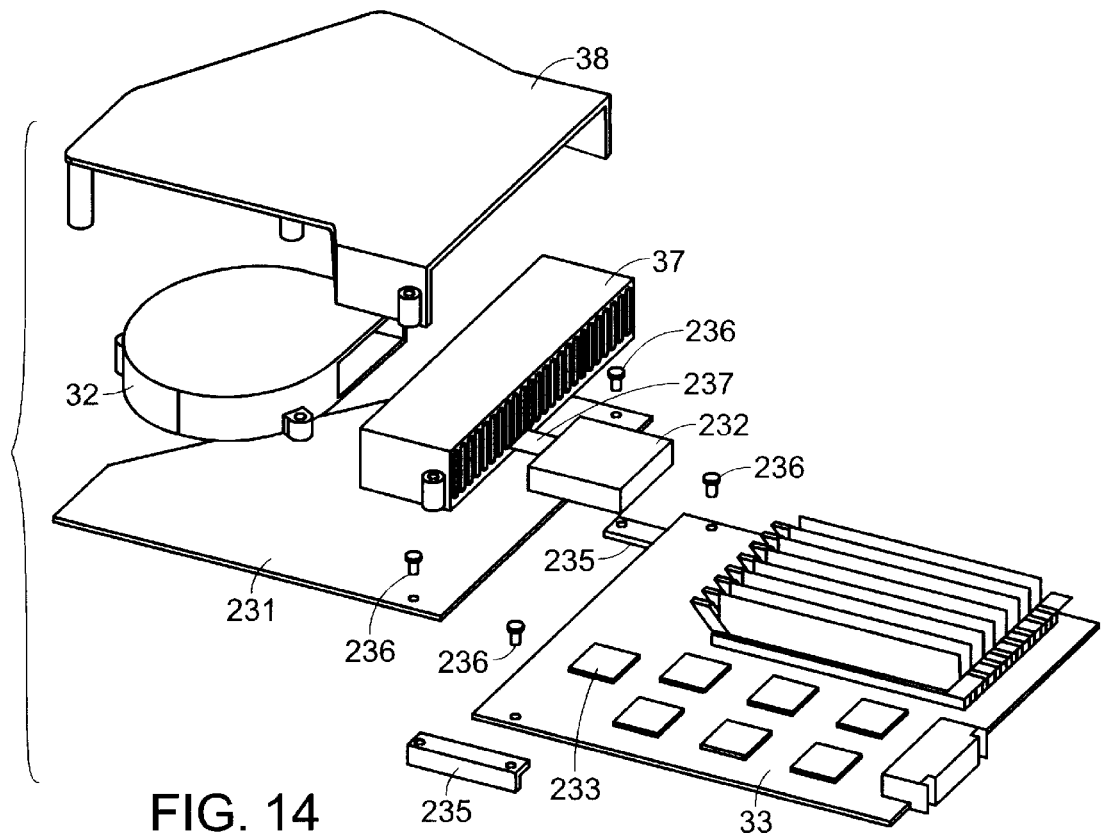
FIG. 14 shows a perspective view of the system shown in FIG. 13 with the components lifted from the second surface, in accordance with one embodiment of the invention.

In accordance with one embodiment of the invention, blower 32 in FIG. 13 is mounted to a second surface 231 which is located in front of surface 33, while FIG. 14 is a view of FIG. 13 with the cooling components lifted from second surface 231. Second surface 231 may be attached to surface 33 by various means known in the art, such as by the use of brackets 235 and associated mounting hardware 236. Airflow generated from blower 32 may flow across one or more electronic components mounted to surface 33. Additionally, a mounting plate 232 may make thermal contact with an integrated circuit 233 coupled to surface 33. Heat from the mounting plate 232 is transferred to a heat sink 37 coupled to surface 231 via a heat conductor 237. Heat from heat sink 37 is further transferred to the airflow generated by blower 32. Second surface 231 may also include components to be cooled, such that the cooling system cools components coupled to both second surface 231 and circuit board 33. It is to be understood that instead of mounting plate 232 and heat sink 37, the module may include a cold plate and heat exchanger, or expander and condenser, as described in above embodiments. Associated pumps and other components of the cooling system may be coupled to second surface 231.

The cooling systems described above can be advantageously incorporated into a system and method that includes a cartridge for cooling components. The cartridge may be interchangeable, with cartridges having the same footprint associated with, but not limited to, forced air through a heat sink, forced air through a heat exchanger coupled to a closed-loop fluidic circuit, and forced air through a condenser coupled to a closed-loop refrigeration circuit. Use of interchangeable cartridges, each with a different cooling capacity, allows future upgrades of cooling capabilities on a surface, such as a circuit board, to be accomplished without costly development changes to packaging. Additionally, maintaining the same footprint for each type of cooling technology enables, for example, the circuit board to be designed using initial estimates of the circuit board's cooling requirements, which often cannot be accurately determined without actual measurement or prototyping. During circuit board design, space on the circuit board can be reserved that is equivalent to the footprint of an interchangeable cartridge. Only after determining circuit board cooling requirements, which may include experimentation with interchangeable cartridges having different cooling technologies, is the appropriate cartridge inserted.

Figure 15:
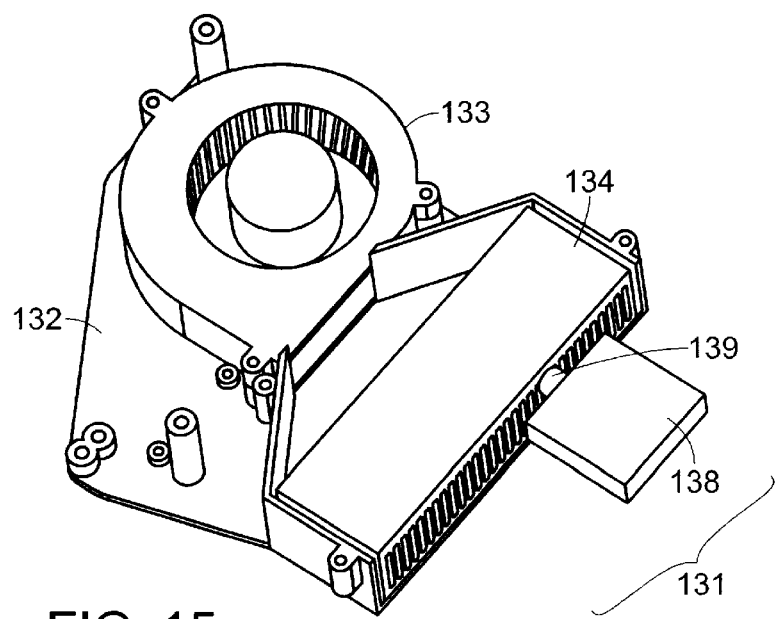
FIG. 15 shows a perspective view of the underside of an interchangeable air-cooled cartridge that includes a heat sink in accordance with one embodiment of the invention.

FIG. 15 shows the underside of an interchangeable air-cooled cartridge 131 that includes, but is not limited to, a heat sink 134, a blower 133, and a shroud 132. Additionally, a mounting plate 138 may be connected to heat sink 134 via a heat conductor 139. Cartridge 131 also may include means for fastening the cartridge, to, for example, the surface which includes components to be cooled, such as thru hole mounting for example.

Figure 16:
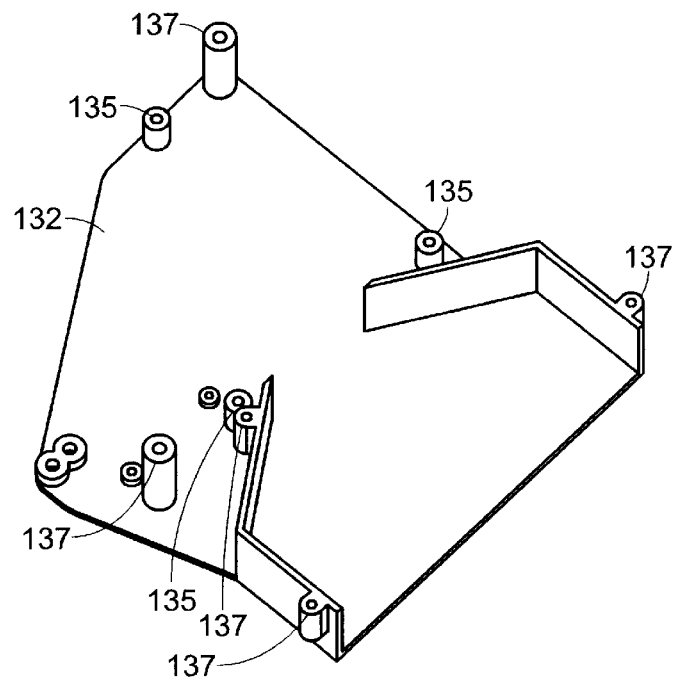
FIG. 16 shows a perspective view of the underside of a shroud for an interchangeable cartridge, in accordance with one embodiment of the invention.

A view of the underside of shroud 132 without blower 133 and heat sink 134 attached is shown in FIG. 16. Shroud 132 may be manufactured out of materials such as, but not limited to, plastic and metal. Mounting holes 135, with appropriate spacing for attaching blower 133 to shroud 132 are incorporated into shroud 132, as are mounting holes 137 for attaching shroud 132 to a surface, which may be, but is not limited to, a circuit board. Other mounting holes located on shroud 132 may be utilized in other cartridge embodiments that include, for example, a closed-loop fluidic circuit or a closed-loop refrigeration circuit. Heat sink 134 may be coupled to shroud 132 by, but not limited to, adhesives, soldering, welding, and mechanical technologies such as thru hole mounting. Shroud 132 may include walls for directing air generated by blower 133 across heat sink 134. It is to be understood that shroud 132 may be of various sizes and shapes, and is not limited to the configuration shown in FIG. 16. Typically, heat is transferred from an integrated circuit to heat sink 134, and from heat sink 134 to air blown from blower 133. Heat may also be transferred from heat sink 134 to shroud 132, with the airflow generated by blower 133 cooling shroud 132.

Figure 17:
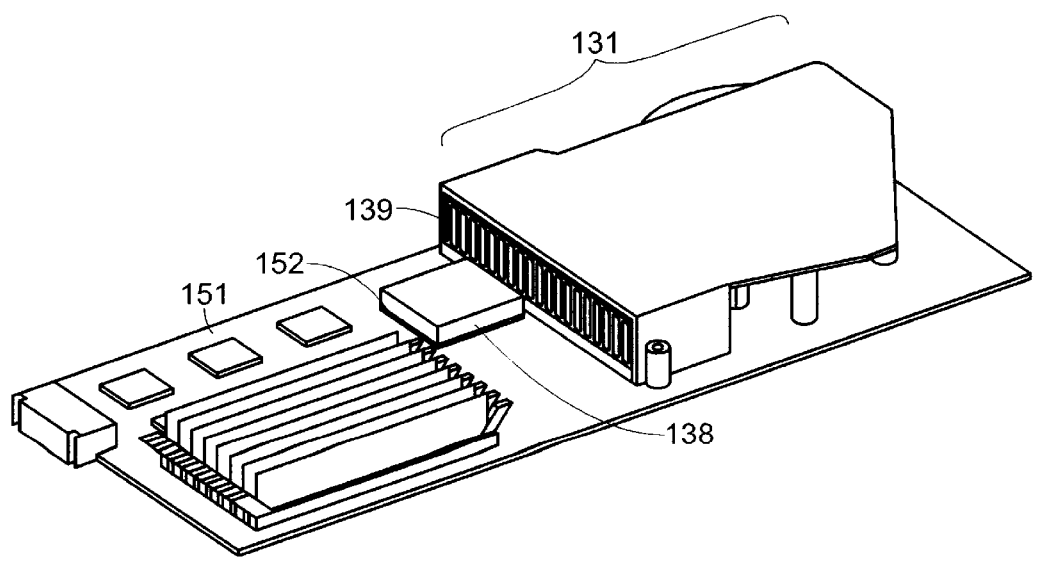
FIG. 17 shows a perspective view of the interchangeable air-cooled cartridge of FIG. 15 coupled to a surface, in accordance with one embodiment of the invention.

FIG. 17 shows cartridge 131 mounted to a surface 151. To minimize the profile of the cartridge, blower 133 may be attached to shroud 132 such that blower's 133 impeller axis is perpendicular to surface 151, however the impeller axis is not limited to this orientation. In various embodiments, which are not meant to be limiting, the dimensions of surface 131 with cartridge 131 attached is less than 1.75" high, and fits into a 1U enclosure. As in above described embodiments, one or more electronic components may be located below blower 133 such that airflow generated by blower 133 flows across the one or more electronic components.

An integrated circuit 152 is mounted to surface 151 such that mounting plate 138 is positioned above, and can be coupled to integrated circuit 152 using, for example, adhesive and mechanical technologies. Heat conductor 139 from heat sink 134 to the mounting plate 139 may be flexible, and/or detachable from heat sink 134, such that the position of mounting plate can be adjusted to mount atop integrated circuit 152. Heat from integrated circuit 152 is transferred to mounting plate 138, and further transferred via heat conductor 139 to heat sink 134, which is then cooled by airflow generated by blower 133. Air flowing across heat sink 134 may also flow across one or more electronic components mounted to surface 151.

In related embodiments, the air-cooled cartridge 131 may not include heat conductor 139 and mounting plate 138. The heat sink can then be directly attached to integrated circuit 152.

Figure 18:
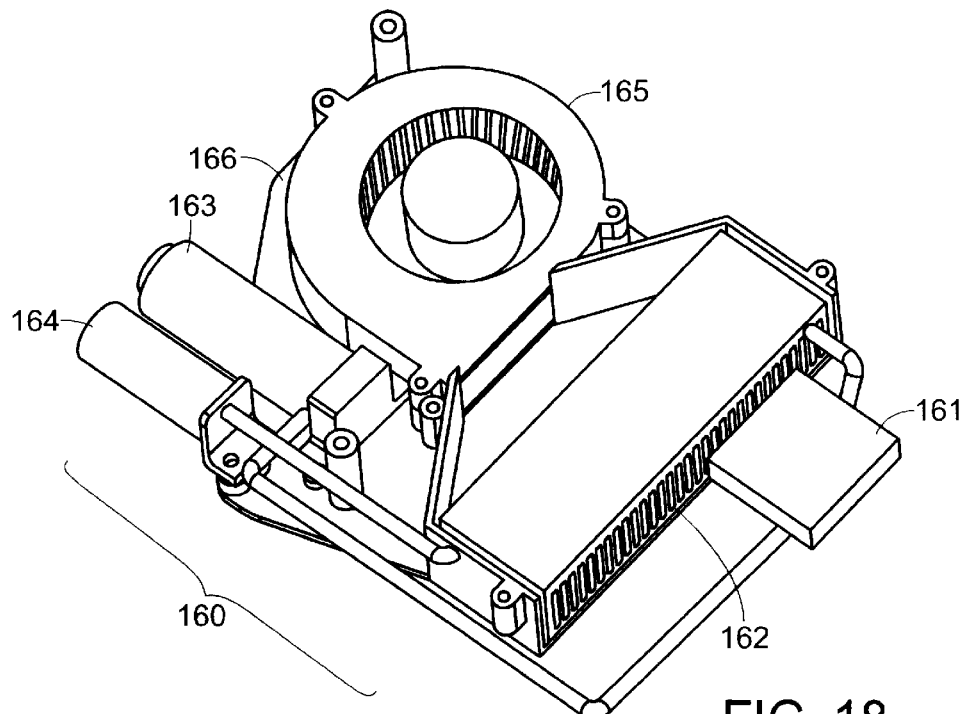
FIG. 18 shows a perspective view of the underside of an interchangeable air-cooled cartridge that includes a closed-loop fluidic circuit, in accordance with one embodiment of the invention.
Figure 19:
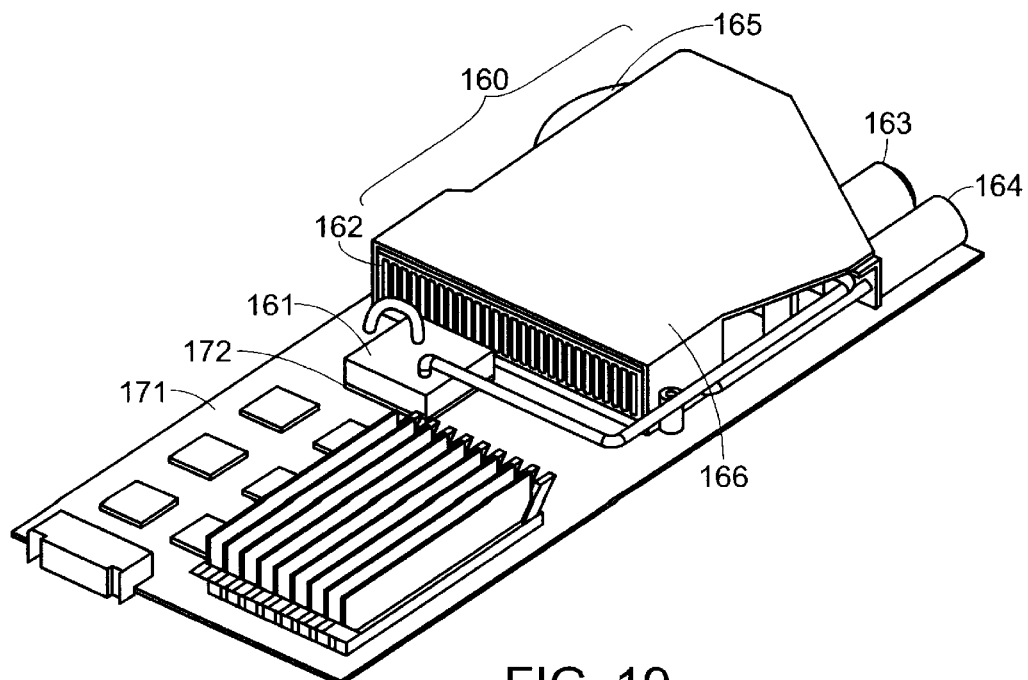
FIG. 19 shows a perspective view of the interchangeable air-cooled cartridge (that includes a closed-loop fluidic circuit) of FIG. 18, coupled to a circuit board, in accordance with one embodiment of the invention.

The underside of an interchangeable cartridge 160 that includes a closed-loop fluidic circuit, rather than a heat sink, is shown in FIG. 18, in accordance with one embodiment of the invention. Cartridge 160 may include, but is not limited to, a cold plate 161, heat exchanger 162, pump 163, expansion tank 164, blower 165, and shroud 166. Shroud 166 may be similar to, and take up the same footprint as shroud 132 shown in FIG. 16, however it is to be understood that shroud 166 is not necessarily limited to this size and shape. Heat exchanger 162 may be coupled to shroud 132 by, but not limited to, adhesives, soldering, welding, and mechanical technologies such as thru hole mounting. Cold plate 161, which is coupled to heat exchanger 162 and pump 163 via tubing, couples, for example, to an integrated circuit 172 when interchangeable cartridge 160 is attached to surface 171, as shown in FIG. 19. Cold plate 161 may be removably coupled to heat exchanger 162, such that variable size and shape tubing can be utilized to accommodate various locations of integrated circuit 172. Alternatively, flexible tubing may be used.

Figure 20:
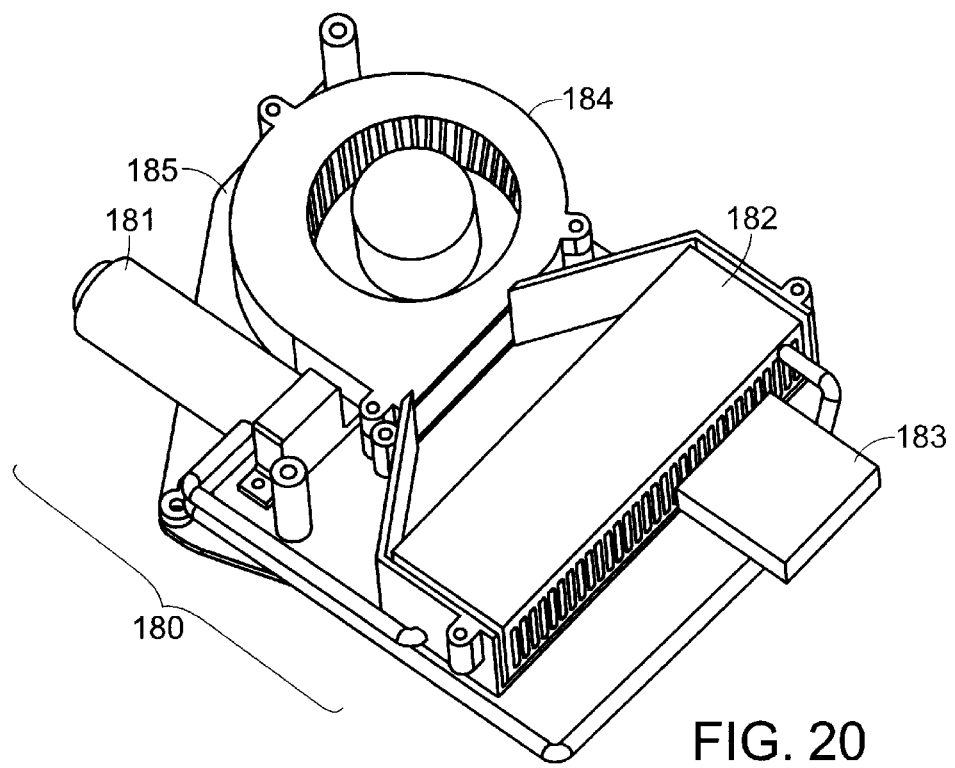
FIG. 20 shows a perspective view of the underside of an interchangeable air-cooled cartridge that includes a closed-loop refrigeration circuit, in accordance with one embodiment of the invention.
Figure 21:
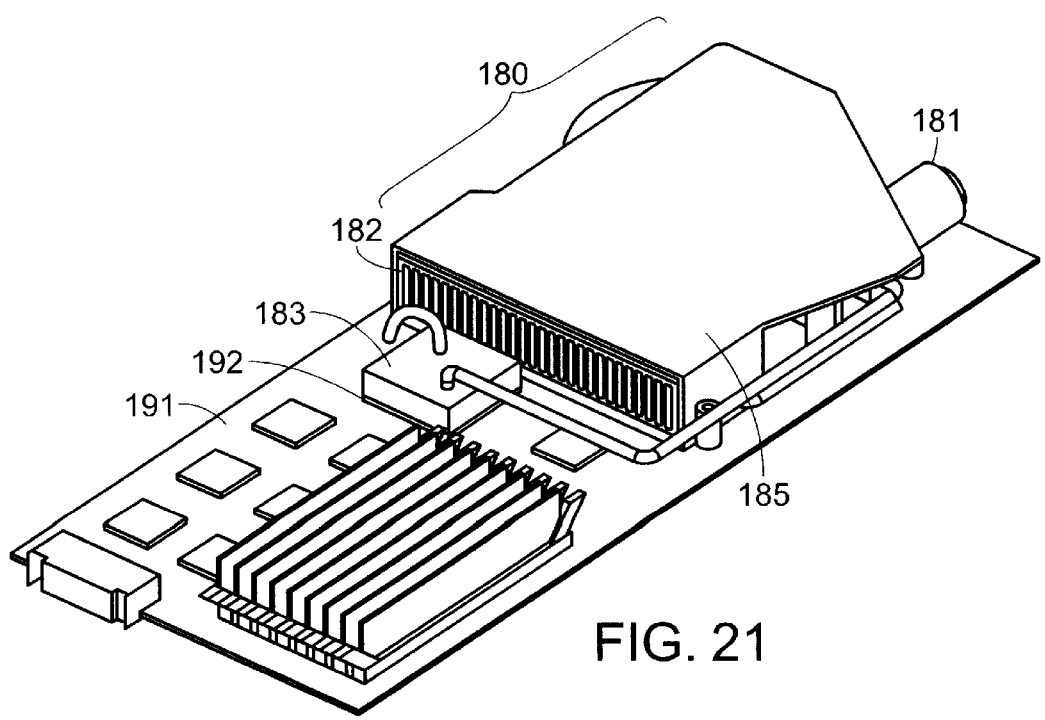
FIG. 21 shows a perspective view of the interchangeable air-cooled cartridge (that includes a closed-loop refrigeration circuit) of FIG. 20 coupled to a surface, in accordance with one embodiment of the invention.

The underside of an interchangeable cartridge 180 that includes a closed-loop refrigeration circuit instead of a heat sink is shown in FIG. 20, in accordance with another embodiment of the invention. In this embodiment, interchangeable cartridge 180 may include, but is not limited to, a compressor 181, condenser 182, expander/evaporator 183, blower 184, and shroud 185. Again, shroud 185 may be similar to, and take up the same footprint as, shroud 132 shown in FIG. 16, however it is to be understood that shroud 185 is not necessarily limited to this size and shape. Condenser 182 may be coupled to shroud 132 by, but not limited to, adhesives, soldering, welding, and mechanical technologies such as thru hole mounting. Expander/evaporator 183 is coupled to an integrated circuit 192, for example, when interchangeable cartridge 180 is attached to surface 191, as shown in FIG. 21. Similar to above described embodiments, expander/evaporator 183 may be removably coupled to condenser 182 and compressor 181, such that variable size and shape tubing can be utilized to accommodate various locations of integrated circuit 192. Flexible tubing may be used.

The interchangeable cartridges referred to in the above-described embodiments need not necessarily include a blower. For example, the cartridge may include a shroud integrated with a heat sink and mounting plate; a heat exchanger, a cold plate, and a pump (closed-loop fluidic circuit); or a compressor, a condenser, an expander, and an evaporator (closed-loop refrigeration circuit). By eliminating the blower, a smaller shroud can be utilized that decreases the footprint of the interchangeable cartridge on a given surface, which may be a circuit board. Airflow can be generated by blowers or fans located elsewhere in the system, with the shroud helping direct the air through the heat sink, heat exchanger, or condenser.

The cartridge, as discussed in above embodiments, may attach to a surface which is a circuit board that includes components to be cooled. The cartridge may be attached to the circuit board such that the footprint of the cartridge is contained within the dimensions of the circuit board. Alternatively, portions of the cartridge may protrude over the edges of the circuit board.

Figure 22:
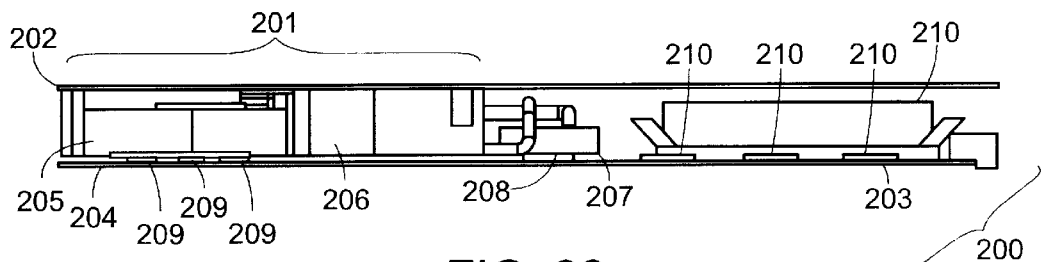
FIG. 22 shows a side view of a system in which a cartridge is attached to a second surface opposite a surface that includes components to be cooled, in accordance with one embodiment of the invention.

In other embodiments, the surface to which the cartridge is attached may not include the components to be cooled. For example, FIG. 22 shows a side view of a system 200 in which a cartridge 201 is attached to a second surface 202 which is positioned opposite a surface 203 that includes components to be cooled. Cartridge 201 includes a blower 205, and a closed-loop fluidic circuit attached to a shroud 206, wherein the closed-loop fluidic circuit includes a heat exchanger (covered by shroud in FIG. 22), a pump (covered by shroud in FIG. 22), and a cold plate 207. Alternatively, cartridge 201 may include other cooling technologies, such as a closed-loop refrigeration circuit or a heat sink, as described in above embodiments. Second surface 202 may be, but not limited to, the backside of an adjacent circuit board. Surface 203 may extend across the length of cartridge 201, as shown in FIG. 20. Cold plate 207 (or alternatively, a mounting plate or expander if heat sink or closed-loop refrigeration circuit cartridge embodiments are utilized, respectively) contacts an integrated circuit 208 coupled to surface 203. Fluid flowing through cold plate 207 is then transferred, via tubing, to the cartridge's heat exchanger, where it is cooled by airflow generated by blower 205. Air flowing across heat exchanger (or alternatively, a heat sink or condenser, if heat sink or closed-loop refrigeration cartridge embodiments are utilized, respectively) may also flow across other components 210 located on surface 203. Additionally, components 209 attached to surface 203 may be located in close proximity to blower port 204, such that air flowing through port 204 flows across components 209.

Figure 23:
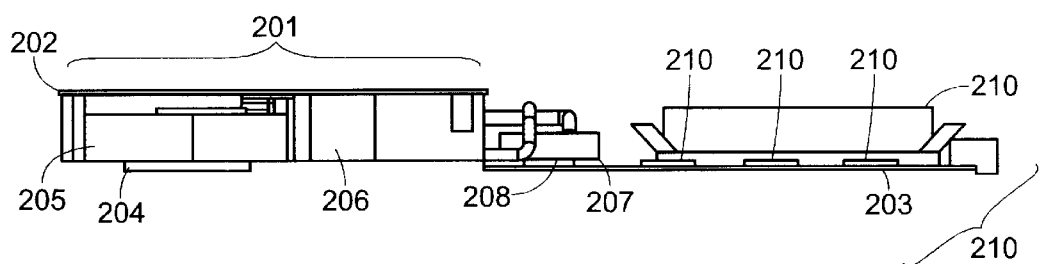
FIG. 23 shows a side view of a system in which a cartridge is attached to a second surface, wherein a portion of the cartridge does not extend over a surface that includes components to be cooled, in accordance with one embodiment of the invention.
Figure 24:
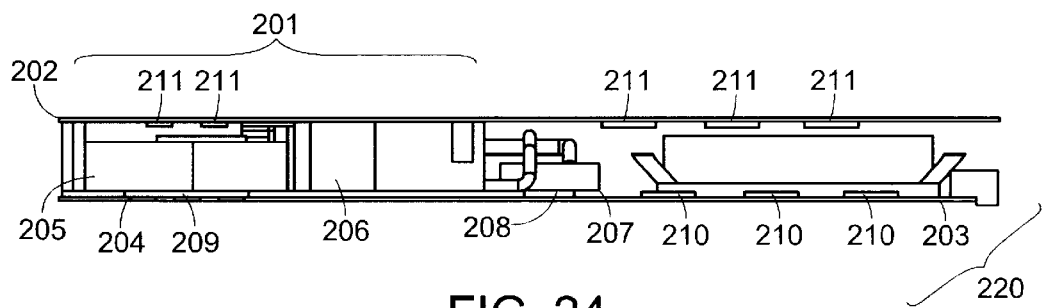
FIG. 24 shows a side view of a system in which a cartridge is attached to a second surface opposite a first surface that includes components to be cooled, wherein the second surface also includes components to be cooled, in accordance with one embodiment of the invention.

In related embodiments, all or portions of second surface 202 may not be positioned over surface 203, as shown in FIG. 23. Cartridge 201 can thus be located in front of or behind surface 203. In this manner, additional clearance for airflow through port 204 may be provided. Second surface 202 may also contain components to be cooled, as shown, for example, in FIG. 24. Air generated by blower 205 may then flow across components located on both second surface 202 and surface 203.

The cooling capacity of each cartridge is dependent on the cooling technology utilized. Upper ranges, which are not meant to be limiting, are 100–120 watts for a cartridge that includes forced air through a heat sink, 110–140 watts for a cartridge that includes forced air through a heat exchanger coupled to a closed-loop fluidic circuit, and 130–200 watts for a cartridge that includes a compressor coupled to a closed-loop refrigeration circuit.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. A system for cooling electronic components, the system comprising:

a surface;

one or more electronic components coupled to the surface, the one or more electronic components including an integrated circuit;

a closed-loop fluidic circuit coupled to the surface for removing heat from the integrated circuit, the closed-loop fluidic circuit including a heat exchanger and a cold plate that is in thermal contact with the integrated circuit, such that fluid heated within the cold plate is received by and flows through the heat exchanger; and a blower coupled to the surface, the blower having a first port, a second port, and an impeller that rotates around an axis, the blower arranged beside the heat exchanger to provide at least one air path between the second port of the blower and the heat exchanger that is parallel to the plane of the surface, wherein the blower moves air across the heat exchanger and also across at least one of the one or more electronic components.

2. The system according to claim 1, wherein the surface is a circuit board.

3. The system according to claim 1, wherein air flows into the first port and out the second port.

4. The system according to claim 1, wherein air flows into the second port and out the first port.

5. The system according to claim 1, wherein the closed-loop fluidic circuit further includes a pump for pumping fluid through the cold plate and the heat exchanger.

6. The system according to claim 1, wherein the cold plate is removably coupled to the closed-loop fluidic circuit.

7. The system according to claim 1, wherein the cold plate is flexibly coupled to the closed-loop fluidic circuit.

8. The system according to claim 5, wherein the pump is one of a centripetal pump or a rotary vane pump.

9. The system according to claim 1, further comprising a shroud positioned such that air flowing through the second port is substantially directed across the heat exchanger.

10. The system according to claim 1, wherein the closed-loop fluidic circuit further includes an expansion tank.

11. The system according to claim 1, wherein the blower generates airflow from the second port of the blower across the heat exchanger and further across at least one of the one or more electronic components mounted to the surface.

12. The system according to claim 1, wherein the blower is oriented so that the first port faces the surface so that air flowing across the first port flows between the blower and the surface.

13. The system according to claim 12, wherein the blower is mounted above a first of the one or more electronic components mounted to the surface, such that air flowing into the first port flows across the first of the one or more electronic components.

14. The system according to claim 1, further comprising an enclosure having a height of about 1.75 inches, the surface enclosed in the enclosure.

15. The system according to claim 1, wherein the system has a height of less than 1.75".

16. A rack comprising:

a mounting fixture; and a plurality of the systems of claim 1 mounted in the mounting fixture in parallel.

17. A system for cooling electronic components, the system comprising:

a surface;

one or more electronic components coupled to the surface, the one or more electronic components including an integrated circuit;

a closed-loop fluidic circuit coupled to the surface for removing heat from the integrated circuit, the closed-looped fluid circuit including a heat exchanger and a cold plate that is in thermal contact with the integrated circuit, such that fluid heated within the cold plate is received by and flows through the heat exchanger; and a blower coupled to the surface, the blower having a first port, a second port, and an impeller that rotates around an axis, the blower oriented such that the axis is perpendicular to the surface and non-intersecting with the heat exchanger, wherein the blower moves air through the heat exchanger, wherein the blower moves air across the heat exchanger and also across at least one of the one or more electronic components.

18. The system according to claim 17, wherein the surface is a circuit board.

19. The system according to claim 17, wherein air flows into the first port and out the second port.

20. The system according to claim 17, wherein air flows into the second port and out the first port.

21. The system according to claim 17, wherein the closed-loop fluidic circuit further includes a pump for pumping fluid through the cold plate and the heat exchanger.

22. The system according to claim 21, wherein the pump is one of a centripetal pump and a rotary vane pump.

23. The system according to claim 17, wherein the cold plate is removably coupled to the closed-loop fluidic circuit.

24. The system according to claim 17, wherein the cold plate is flexibly coupled to the closed-loop fluidic circuit.

25. The system according to claim 17, wherein the blower generates airflow from the second port of the blower across the heat exchanger and further across at least one of the one or more electronic components mounted to the surface.

26. The system according to claim 17, further comprising a shroud positioned such that air flowing through the second port is substantially directed across the heat exchanger.

27. The system according to claim 17, wherein the closed-loop fluidic circuit further includes an expansion tank.

28. The system according to claim 17, wherein the blower is oriented so that the first port faces the surface such that air flowing across the first port flows between the blower and the surface.

29. The system according to claim 28, wherein the blower is mounted above a first of the one or more electronic components mounted to the surface, such that air flowing through the first port flows across the first of the one or more electronic components.

30. The system according to claim 17, further comprising an enclosure having a height of substantially 1.75 inches, the system enclosed in the 1U enclosure.

31. A rack comprising:

a mounting fixture; and a plurality of the low profile systems of claim 17 mounted in the mounting fixture in parallel.

32. A system for cooling electronic components, the system comprising:

a first surface;

one or more electronic components coupled to the first surface, the one or more electronic components including an integrated circuit; and a module attached to a second surface, the module including:

a closed-loop fluidic circuit for removing heat from the integrated circuit, the closed-loop fluidic circuit including a heat exchanger and a cold plate that is in thermal contact with the integrated circuit, such that fluid heated within the cold plate is received by and flows through the heat exchanger; and a blower for moving air across the heat exchanger and also across at least one of the one or more electronic components.

33. The system according to claim 32, wherein the first surface and second surface are non-overlapping.

34. The system according to claim 32, wherein the second surface is located above the first surface.

35. The system according to claim 32, the closed-loop fluidic circuit further including a pump for pumping fluid through the cold plate.

36. The system according to claim 32, wherein the blower has an impeller axis that is perpendicular to the plane of the first surface.

37. The system according to claim 32, wherein the blower provides at least one airflow path between a port of the blower and the one or more electronic components that is parallel to the plane of the first surface.

38. The system according to claim 32, wherein the first surface is a circuit board.

39. A system for cooling electronic components, the system comprising:

a first surface;

one or more electronic components coupled to the first surface, the one or more electronic components including an integrated circuit; and a module coupled to and positioned beside the first surface, the module including:

a closed-loop fluidic circuit for removing heat from the integrated circuit, the closed-loop fluidic circuit including a heat exchanger and a cold plate that is in thermal contact with the integrated circuit, such that fluid heated within the cold plate is received by and flows through the heat exchanger; and a blower for moving air across the heat exchanger and also across at least one of the one or more electronic components.

40. The system according to claim 39, the closed-loop fluidic circuit further including a pump for pumping fluid through the cold plate.

41. The system according to claim 39, wherein the blower has an impeller axis that is perpendicular to the plane of the first surface.

42. The system according to claim 39, wherein the blower provides at least one airflow path between a port of the blower and the one or more electronic components that is parallel to the plane of the first surface.

* * * * *